(12) United States Patent
Xavier et al.

(10) Patent No.: US 9,281,429 B2
(45) Date of Patent: Mar. 8, 2016

(54) MODULE LEVEL SOLUTIONS TO SOLAR CELL POLARIZATION

(75) Inventors: Grace Xavier, Fremont, CA (US); Bo Li, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 792 days.

(21) Appl. No.: 13/458,737

(22) Filed: Apr. 27, 2012

(65) Prior Publication Data

US 2014/0034113 A1 Feb. 6, 2014

Related U.S. Application Data

(63) Continuation of application No. 12/538,034, filed on Aug. 7, 2009, now Pat. No. 8,188,363.

(51) Int. Cl.
| | |
|---|---|
| *H01L 31/048* | (2014.01) |
| *H01L 31/02* | (2006.01) |
| *H01L 31/0216* | (2014.01) |
| *H01L 31/049* | (2014.01) |
| H01L 31/068 | (2012.01) |

(52) U.S. Cl.
CPC ........ *H01L 31/048* (2013.01); *H01L 31/02167* (2013.01); *H01L 31/049* (2014.12); *H01L 31/0682* (2013.01); *Y02E 10/50* (2013.01)

(58) Field of Classification Search
CPC ...... H01L 31/048; H01L 31/042; B29C 65/00
USPC .................................. 136/200–293; 250/200
See application file for complete search history.

(56) References Cited

U.S. PATENT DOCUMENTS

| | | |
|---|---|---|
| 4,070,097 A | 1/1978 | Gelber et al. |
| 4,084,099 A | 4/1978 | Harvey et al. |
| 4,278,831 A | 7/1981 | Riemer et al. |
| 4,496,788 A | 1/1985 | Hamakawa et al. |

(Continued)

FOREIGN PATENT DOCUMENTS

| | | |
|---|---|---|
| DE | 102006048216 A1 | 4/2008 |
| EP | 1 172 864 A1 | 1/2002 |

(Continued)

OTHER PUBLICATIONS

K. J. Lewis, In Polymers in Solar Energy Utilization: Gebelein, C., et al; ACS Symposium Series; American Chemical Society: Washington, DC, 1983.*

(Continued)

*Primary Examiner* — Jeffrey T Barton
*Assistant Examiner* — Michael Y Sun
(74) *Attorney, Agent, or Firm* — Okamoto & Benedicto LLP

(57) ABSTRACT

A solar cell module includes interconnected solar cells, a transparent cover over the front sides of the solar cells, and a backsheet on the backsides of the solar cells. The solar cell module includes an electrical insulator between the transparent cover and the front sides of the solar cells. An encapsulant protectively packages the solar cells. To prevent polarization, the insulator has resistance suitable to prevent charge from leaking from the front sides of the solar cells to other portions of the solar cell module by way of the transparent cover. The insulator may be attached (e.g., by coating) directly on an underside of the transparent cover or be a separate layer formed between layers of the encapsulant. The solar cells may be back junction solar cells.

14 Claims, 5 Drawing Sheets

(56) References Cited

U.S. PATENT DOCUMENTS

| | | |
|---|---|---|
| 4,509,248 A | 4/1985 | Spitzer et al. |
| 5,053,083 A | 10/1991 | Sinton |
| 5,057,439 A | 10/1991 | Swanson et al. |
| 5,066,340 A | 11/1991 | Iwamoto et al. |
| 5,213,628 A | 5/1993 | Noguchi et al. |
| 5,468,652 A | 11/1995 | Gee |
| 5,660,646 A | 8/1997 | Kataoka et al. |
| 5,728,230 A | 3/1998 | Komori et al. |
| 6,013,582 A | 1/2000 | Ionov et al. |
| 6,118,258 A | 9/2000 | Farine et al. |
| 6,130,379 A | 10/2000 | Shiotsuka |
| 6,210,991 B1 | 4/2001 | Wenham et al. |
| 6,311,436 B1 | 11/2001 | Mimura et al. |
| 6,465,724 B1 | 10/2002 | Garvison et al. |
| 6,521,825 B2 | 2/2003 | Miura et al. |
| 6,777,610 B2 | 8/2004 | Yamada et al. |
| 7,554,031 B2 | 6/2009 | Swanson et al. |
| 8,188,363 B2 | 5/2012 | Xavier et al. |
| 2002/0020440 A1 | 2/2002 | Yoshimine et al. |
| 2003/0070707 A1 | 4/2003 | King et al. |
| 2003/0178056 A1 | 9/2003 | Hikosaka et al. |
| 2005/0178428 A1 | 8/2005 | Laaly et al. |
| 2006/0196535 A1 * | 9/2006 | Swanson ........... H01L 31/02167 136/244 |
| 2006/0201545 A1 | 9/2006 | Ovshinsky et al. |
| 2008/0128018 A1 * | 6/2008 | Hayes ............... B32B 17/10018 136/249 |
| 2010/0047589 A1 | 2/2010 | Ochs et al. |

FOREIGN PATENT DOCUMENTS

| | | |
|---|---|---|
| EP | 1 830 411 A1 | 9/2007 |
| JP | 2001-291881 | 10/2001 |
| JP | 2007-35694 | 2/2007 |
| JP | 2009-170890 | 7/2009 |

OTHER PUBLICATIONS

European Extended Search Report for Application No. EP 10 80 6776.0, Sep. 26, 2013, 8 sheets.

\* cited by examiner

|  | | ASTM | Fluon ETFE |
|---|---|---|---|
| Light transmittance(50 μm thickness film) | % | | 95 |
| Melting temp. | °C (°F) | | 260 (500) |
| Continuous service temp. | °C (°F) | | -100 to 150 (-148 to 302) |
| Oxygen index | % | D2863 | 31 |
| Linear thermal expansion coefficient | 1/°C | D696 | $5.9 \times 10^{-4}$ |
| Shrinkage (150°C×30min) | % | | -2 to 1 |
| Tear strength (Elmendolf) | g/25μm | D1922 | 1400 to 2400 |
| Tensile strength | MPa | D638 | 69 |
| Tensile elongation | % | D638 | 420 |
| Tensile modulas | MPa | D638 | 824 |
| Volume specific resistance | Ωcm | D257 | $>10^{16}$ |
| Dielectric constant ($10^3$ Hz) | - | D150 | 2.6 |
| Water absorption | % | D570 | 0.03 |
| Moisture permiation (25 μm(1 mil)) | g/(m²·24h) | E96 | 6 |
| Acid resistance | | D543 | A |
| Alkari resistance | | D543 | A |
| Solvent resistance | | D543 | A |

A: Excellent  B: Fair  C: Poor

FIG. 3

MODULE LEVEL SOLUTIONS TO SOLAR CELL POLARIZATION

REFERENCES TO RELATED APPLICATION

This application is a continuation of U.S. patent application Ser. No. 12/538,034, filed on Aug. 7, 2009, which is incorporated herein by reference in its entirety.

BACKGROUND OF THE INVENTION

1. Field of the Invention

The present invention relates generally to solar cells, and more particularly but not exclusively to solar cell modules.

2. Description of the Background Art

Solar cells are well known devices for converting solar radiation to electrical energy. They may be fabricated on a semiconductor wafer using semiconductor processing technology. Generally speaking, a solar cell may be fabricated by forming p-type regions and n-type regions in a silicon substrate. Each adjacent p-type region and n-type region forms a p-n junction. Solar radiation impinging on the solar cell creates electrons and holes that migrate to the p-type and n-type regions, thereby creating voltage differentials across the p-n junctions. In a back junction solar cell, the p-type and n-type regions are formed on the backside along with the metal contacts that allow an external electrical circuit or device to be coupled to and be powered by the solar cell. Back junction solar cells are also disclosed in U.S. Pat. Nos. 5,053,083 and 4,927,770, which are both incorporated herein by reference in their entirety.

Several solar cells may be connected together to form a solar cell array. The solar cell array may be packaged into a solar cell module, which includes protection layers to allow the solar cell array to withstand environmental conditions and be used in the field.

If precautions are not taken, solar cells may become highly polarized in the field, causing reduced output power. Solutions to solar cell polarization are disclosed in U.S. Pat. No. 7,554,031, which is incorporated herein by reference in its entirety. The present disclosure pertains to module-level solutions to solar cell polarization.

SUMMARY

In one embodiment, a solar cell module includes interconnected solar cells, a transparent cover over the front sides of the solar cells, and a backsheet on the backsides of the solar cells. The solar cell module includes an electrical insulator between the transparent cover and the front sides of the solar cells. An encapsulant protectively packages the solar cells. To prevent polarization, the insulator has resistance suitable to prevent charge from leaking from the front sides of the solar cells to other portions of the solar cell module by way of the transparent cover. The insulator may be attached (e.g., by coating) directly on an underside of the transparent cover or be a separate layer formed between layers of the encapsulant. The solar cells may be back junction solar cells.

These and other features of the present invention will be readily apparent to persons of ordinary skill in the art upon reading the entirety of this disclosure, which includes the accompanying drawings and claims.

DESCRIPTION OF THE DRAWINGS

FIG. 3 shows the general properties of an insulator suitable for use in the solar cell module of FIG. 1.

The use of the same reference label in different drawings indicates the same or like components. The figures are not drawn to scale.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
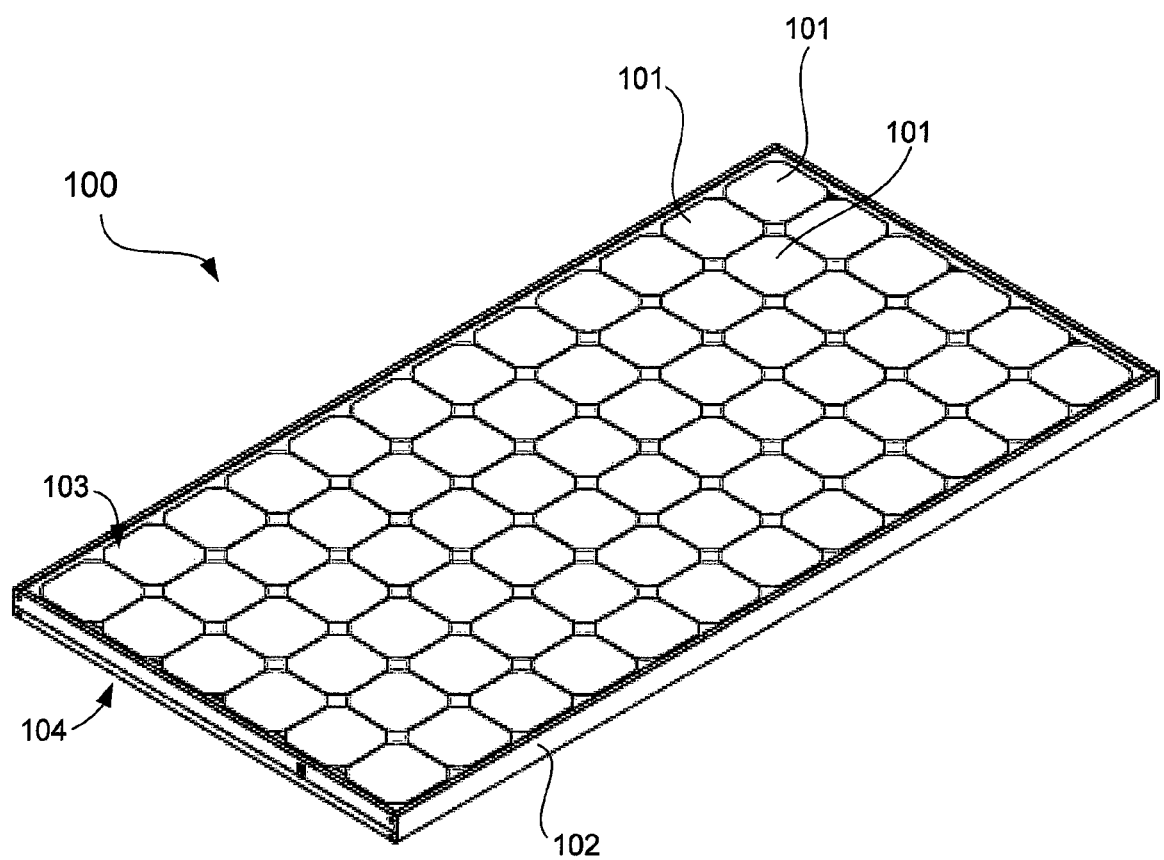
FIG. 1 shows a solar cell module in accordance with an embodiment of the present invention.

FIG. 1 shows a solar cell module 100 in accordance with an embodiment of the present invention. The solar cell module 100 is a so-called "terrestrial solar cell module" in that it is designed for use in stationary applications, such as on rooftops or by power generating stations. In the example of FIG. 1, the solar cell module 100 includes an array of interconnected solar cells 101. Only some of the solar cells 101 are labeled in FIG. 1 for clarity of illustration. The solar cells 101 may comprise back junction solar cells, which are especially vulnerable to polarization. Visible in FIG. 1 are the front sides of the solar cells 101, which face the sun during normal operation. The backsides of the solar cells 101 are opposite the front sides. A frame 102 provides mechanical support for the solar cell array.

The front portion of the solar cell module 100, which is labeled as 103, is on the same side as the front sides of the solar cells 101 and is visible in FIG. 1. The back portion 104 of the solar cell module 100 is under the front portion 103. As will be more apparent below, the front portion 103 includes layers of optically transparent protective and insulating materials that are formed over the front sides of the solar cells 101.

Figure 2:
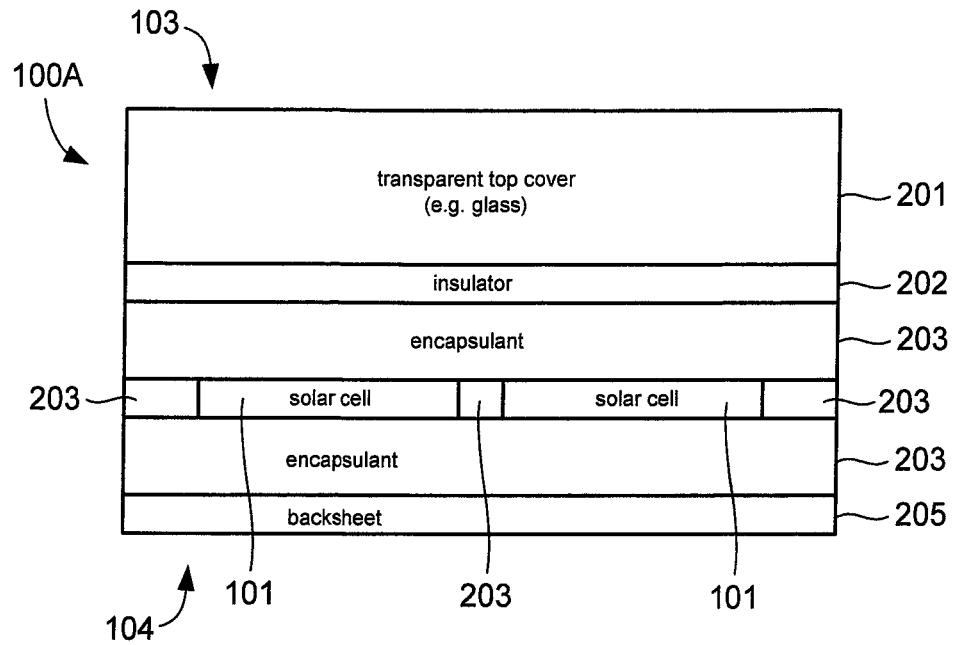
FIG. 2 shows a cross-section of the solar cell module of FIG. 1 in accordance with an embodiment of the present invention.

FIG. 2 shows a cross-section of the solar cell module 100 in accordance with an embodiment of the present invention. The solar cell module 100 of FIG. 2 has been labeled as "100A" to distinguish this embodiment from the embodiment of FIG. 4. As shown in FIG. 2, the solar cell module 100A includes a transparent cover 201, an electrical insulator 202, encapsulant 203, the solar cells 101, and a backsheet 205. The transparent cover 201, the insulator 202, and the encapsulant 203 are optically transparent materials. The transparent cover 201, which is the topmost layer on the front side 103, protects the solar cells 101 from the environment. The solar cell module 100A is installed such that the transparent cover 201 faces the sun during normal operation. The front sides of the solar cells 101 face towards the sun by way of the transparent cover 101. In the example of FIG. 2, the transparent cover 201 comprises glass (e.g., 3.2 mm thick, soda lime glass) coated with the insulator 202 on the side facing towards the solar cells 101.

The encapsulant 203 bonds the solar cells 101, the transparent cover 201 coated with the insulator 202, and the backsheet 205 to form a protective package. In one embodiment, the encapsulant 203 comprises poly-ethyl-vinyl acetate ("EVA").

The backsides of the solar cells 101 face the backsheet 205, which is attached to the encapsulant 203. In one embodiment, the backsheet 205 comprises Tedlar/Polyester/EVA ("TPE"). In the TPE, the Tedlar is the outermost layer that protects against the environment, the polyester provides additional electrical isolation, and the EVA is a non-crosslinked thin layer that promotes adhesion to the encapsulant 203. Alternatives to TPE for use as the backsheet 205 include Tedlar/Polyester/Tedlar ("TPT"), for example.

The solar cells 101 are electrically isolated from the frame 102. The insulator 202, which is external to the solar cells 101, is configured to prevent solar cell polarization by preventing charge from leaking from the front sides of the solar cells 101 to the frame 102 or other portions of the solar cell module 100A by way of the transparent cover 201. To be effective in preventing polarization, the inventors discovered that the insulator 202 preferably has a volume specific resistance equal to or greater than $10^{16}$ (e.g., $10^{16}$-$10^{19}$) Ωcm over a normal operating temperature range of 45 to 85° C.

The insulator 202 may comprise a fluorocarbon-based polymer. In one embodiment, the insulator 202 comprises Fluon® ETFE (ethylene tetrafluoroethylene) available from Asahi Glass Co, LTD of Japan. The general properties of the Fluon® ETFE are shown in FIG. 3. In the example of FIG. 2, the Fluon® ETFE is 2 to 6 mils and is coated on the underside of a 3.2 mm thick glass transparent cover 201. As can be appreciated, given the guidance of the present disclosure, suitable electrical insulators other than the Fluon® ETFE may also be used without detracting from the merits of the present invention.

Figure 4:
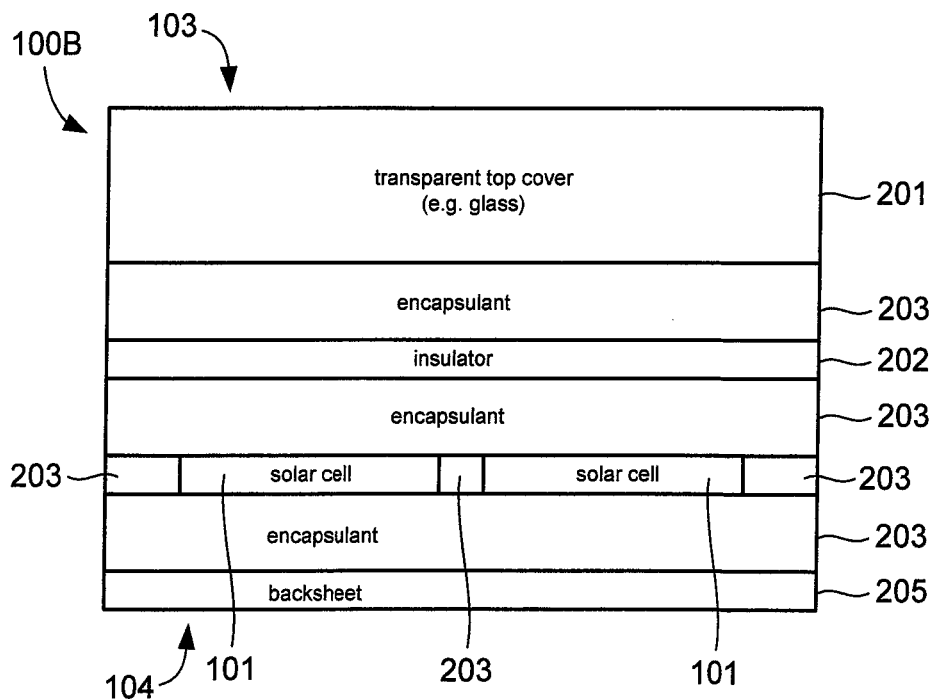
FIG. 4 shows a cross-section of the solar cell module of FIG. 1 in accordance with another embodiment of the present invention.

FIG. 4 shows a cross-section of the solar cell module 100 in accordance with another embodiment of the present invention. The solar cell module 100 of FIG. 4 has been labeled as "100B" to distinguish this embodiment from the embodiment of FIG. 2. The solar cell module 100B is the same as the solar cell module 100A except that the insulator 202 is a separate layer of material sandwiched between layers of the encapsulant 203, rather than being attached (e.g., by coating) directly under the transparent cover 201. The components of FIG. 4 have already been described with reference to the embodiment of FIG. 2. Compared to the embodiment of FIG. 2, the solar cell module 100B is more suitable in cases where the insulator 202 cannot be coated directly to the transparent cover 201. In the example of FIG. 4, the encapsulant 203 bonds the solar cells 101, the transparent cover 201, the insulator 202, and the backsheet 205 to form a protective package.

Figure 5:
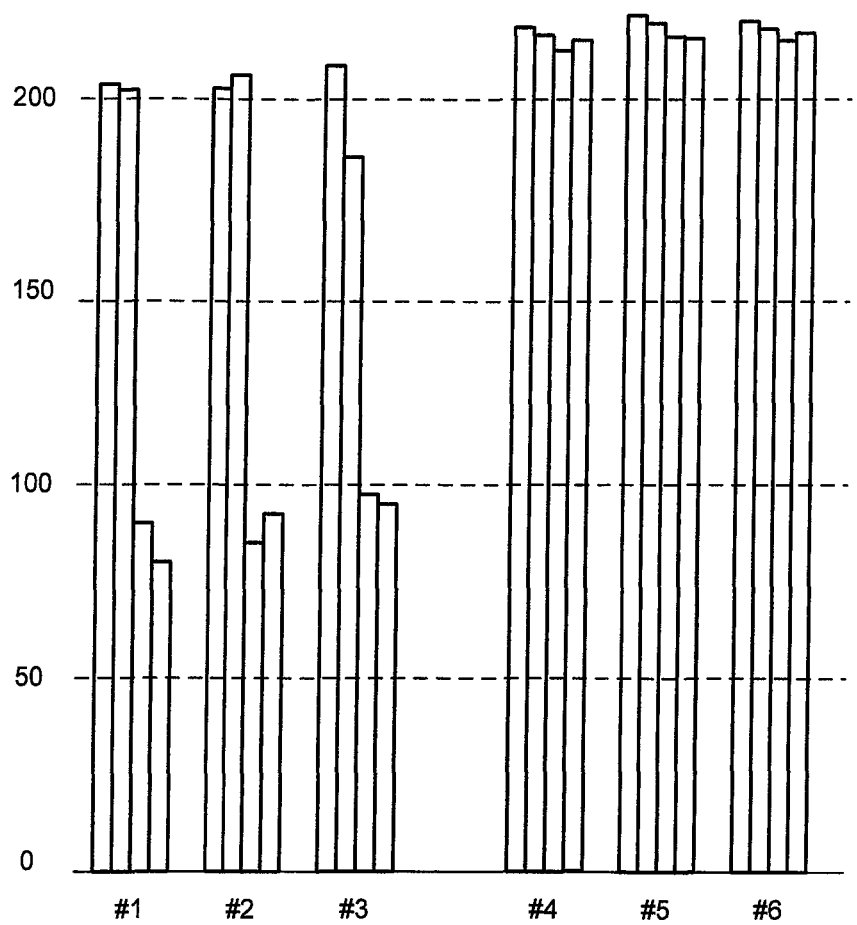
FIG. 5 shows test data comparing the module-level polarization solution of using an insulator to control samples that do not have the insulator.

FIG. 5 shows test data comparing the module-level polarization solution of using an insulator 202 to control samples that do not have an insulator layer. In FIG. 5, the vertical axis represents module output power. The horizontal axis shows test data for samples #1, #2, #3, #4, #5, and #6. Samples #1, #2, and #3 are solar cell modules that do not use a insulator layer to prevent polarization, while samples #4, #5, and #6 are solar cell modules similar to the solar cell module 100 where the insulator 202 is between the transparent glass cover and the solar cells. The performance of the samples was measured in four separate days, represented by the four bar graphs for each sample. For each sample, the leftmost bar graph is for the first day, the following bar graph is taken several days later, and so on. As can be seen in FIG. 5, the performance of samples #1, #2, and #3 decreases with time due to polarization. On the other hand, the performance of samples #4, #5, and #6 is relatively stable, indicating a more effective solution to polarization.

The test data of FIG. 5 indicates that placing the insulator 202 on top of a glass transparent cover, which is relatively easy to implement, provides polarization protection. However, a top most insulator 202 has several potential drawbacks. The insulator 202 would be directly exposed to ultraviolet (UV) radiation and would thus degrade at a higher rate and loose its volumetric resistivity. Additionally, a polymer insulator 202 tends to soil more than the glass transparent cover and will fail hail impact test requirements.

Figure 6:
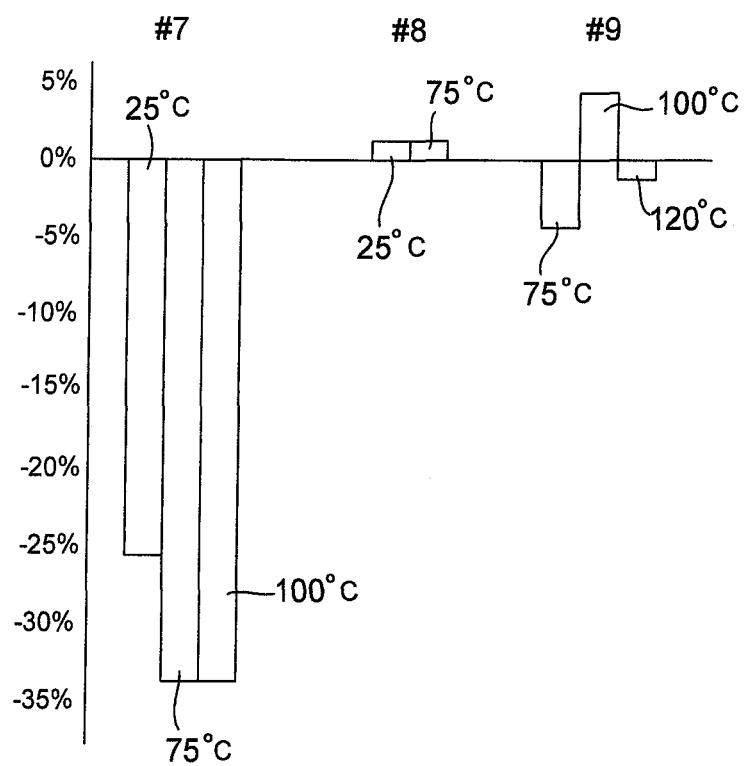
FIG. 6 shows test data comparing the effect of placing the insulator above and under a glass top cover.

FIG. 6 shows test data comparing the effect of placing the insulator 202 above and under a glass top cover. In FIG. 6, the vertical axis represents efficiency and the horizontal axis shows bar graphs for samples #7, #8, and #9 for different indicated temperatures. Sample #7 is a conventional solar cell module used for control. Sample #8 is similar to sample #7 except for the addition of an insulator 202 under a glass transparent cover, sample #9 is similar to sample #7 except for the addition of an insulator 202 over a glass transparent cover. The test was conducted at temperatures up to 120° C. under voltage bias by applying 1000V DC on the sample for 1 hour.

In FIG. 6, the low efficiency of sample #7 is attributed to polarization. As can be seen from FIG. 6, the use of the insulator 202 in samples #8 and #9 has a marked impact on efficiency. The test data of FIG. 6 also shows that placing the insulator 202 under the transparent cover (sample #8) has the unexpected result of providing more protection from polarization compared to placing the insulator 202 over the transparent cover (sample #9).

The insulator 202 increases production complexity and cost, and adds another layer of material through which solar radiation must pass through. However, using the insulator 202 as described herein to prevent polarization more than compensates for the aforementioned negatives. Furthermore, the insulator 202 allows for prevention of polarization without having to make changes to the solar cells 101 or changing the electrical, such as grounding, or system-level configuration of the solar cell module 100 (i.e., 100A or 100B). The module-level solution to polarization described herein can thus be readily implemented in currently available or new design solar cell modules.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell module comprising:
   a plurality of interconnected solar cells, each of the solar cells having a front side that faces the sun during normal operation and a backside opposite the front side;
   an encapsulation that encapsulates the solar cells;
   a backsheet under the encapsulation; and
   a glass cover over the encapsulation, the glass cover including a single layer coating of electrical insulator that is coated directly on an underside of the glass cover facing front sides of the solar cells, the glass cover including the single layer coating of electrical insulator being external to the encapsulation,
   wherein the single layer coating of electrical insulator comprises a fluorocarbon.

2. The solar cell module of claim 1 wherein the solar cells comprise back junction solar cells.

3. The solar cell module of claim 1 wherein the encapsulation comprises a sheet of encapsulant that comprises poly-ethyl-vinyl acetate.

4. The solar cell module of claim 1 wherein the single layer coating of electrical insulator has a volumetric resistance equal to or greater than $10^{16}$ Ωcm over a temperature range of 45 to 85 degrees centigrade.

5. A solar cell module comprising:
a plurality of interconnected solar cells, each of the solar cells comprising back junction solar cells having a front side that faces the sun during normal operation and a backside opposite the front side;
an encapsulation that encapsulates the solar cells;
a glass cover over front sides of the solar cells over the encapsulation;
a single layer of electrical insulator between the glass cover and the encapsulation, the single layer of electrical insulator being formed end-to-end of the solar cell module such that electrical charges are prevented from leaking from the front sides of the solar cells to a frame of the solar cell module through the glass cover; and
a backsheet on backsides of the solar cells under the encapsulation,
wherein the single layer of electrical insulator is directly on the glass cover and comprises a fluorocarbon.

6. The solar cell module of claim 5 wherein the single layer of electrical insulator is coated directly on an underside of the glass cover.

7. The solar cell module of claim 5 wherein the encapsulation comprises a sheet of encapsulant that comprises poly-ethyl-vinyl acetate.

8. The solar cell module of claim 5 wherein the single layer of electrical insulator has a resistance equal to or greater than $10^{16}$ Ωcm.

9. The solar cell module of claim 5 wherein the single layer of electrical insulator has a volumetric resistance equal to or greater than $10^{16}$ Ωcm over a temperature range of 45 to 85 degrees centigrade.

10. A solar cell module comprising:
a frame;
a plurality of interconnected solar cells, each of the solar cells having a front side that faces the sun during normal operation and a backside opposite the front side; and
a glass cover over front sides of the solar cells, the glass cover including a single layer coating of electrical insulator that is coated directly on an underside of the glass cover facing front sides of the solar cells,
wherein the single layer coating of electrical insulator comprises a fluorocarbon.

11. The solar cell module of claim 10 wherein the single layer coating of electrical insulator has a resistance equal to or greater than $10^{16}$ Ωcm.

12. The solar cell module of claim 10 further comprising:
a backsheet on backsides of the solar cells; and
an encapsulation that encapsulates the solar cells, wherein the glass cover is over the encapsulation and the backsheet is under the encapsulation.

13. The solar cell module of claim 12 wherein the encapsulation comprises a sheet of encapsulant that comprises poly-ethyl-vinyl acetate.

14. The solar cell module of claim 10 wherein the single layer coating of electrical insulator has a resistance of $10^{16}$ Ωcm over a temperature range of 45 to 85 degrees centigrade.

* * * * *